(12) United States Patent
Hara

(10) Patent No.: US 6,297,448 B1
(45) Date of Patent: Oct. 2, 2001

(54) INNER AND OUTER PRESSURE EQUALIZATION STRUCTURE FOR AN AIRTIGHT CASE

(75) Inventor: Kouichi Hara, Aichi (JP)

(73) Assignee: Tokai Kogyo Co., Ltd., Aichi (JP)

( * ) Notice: Subject to any disclaimer, the term of this patent is extended or adjusted under 35 U.S.C. 154(b) by 0 days.

(21) Appl. No.: 09/367,159

(22) PCT Filed: Dec. 9, 1998

(86) PCT No.: PCT/JP98/05568

§ 371 Date: Nov. 8, 1999

§ 102(e) Date: Nov. 8, 1999

(87) PCT Pub. No.: WO99/30544

PCT Pub. Date: Jun. 17, 1999

(30) Foreign Application Priority Data

Dec. 9, 1997 (JP) ........................................ 9-354009

(51) Int. Cl.⁷ .................................................. H05K 5/06
(52) U.S. Cl. .................. 174/52.3; 174/50.5; 361/752
(58) Field of Search ............... 174/17 VA, 17 CT, 174/17.05, 50, 50.5, 52.3; 361/752, 757

(56) References Cited

U.S. PATENT DOCUMENTS

| | | | |
|---|---|---|---|
| 2,462,445 | * | 2/1949 | Weiss . |
| 3,607,604 | * | 9/1971 | Nava ................................. 174/17 VA |
| 4,145,588 | * | 3/1979 | Orcutt .................................... 200/83 |
| 5,081,327 | * | 1/1992 | Graham et al. ................... 174/17 VA |
| 5,434,748 | | 7/1995 | Fukui et al. ........................... 361/757 |
| 5,497,290 | | 3/1996 | Fukui et al. ........................... 361/752 |

FOREIGN PATENT DOCUMENTS

| | | |
|---|---|---|
| 58-69991 | 5/1993 | (JP) . |
| 51-60579 | 6/1993 | (JP) . |

* cited by examiner

*Primary Examiner*—Dean A. Reichard
*Assistant Examiner*—Angel R. Estrada
(74) *Attorney, Agent, or Firm*—Duane Morris & Heckscher, LLP

(57) ABSTRACT

An inner and outer pressure difference alleviating device for an air tight case (10) is provided including a housing (20) and a cover (30). The cover is adapted to close an opening in housing (20). A diaphragm portion (34) that is made from a flexible material is formed integrally with cover (30) or a side wall of the housing (20). When a pressure difference between the inside and outside of the airtight case (10) is produced by heat generated by electric and electronic components contained in housing (10) diaphragm portion (34) elastically deforms to change the inner volume of airtight case (10) and eliminate the pressure difference between the inside and outside of airtight case (10) automatically, while retaining the air-tightness of the airtight case (10).

27 Claims, 6 Drawing Sheets

INNER AND OUTER PRESSURE EQUALIZATION STRUCTURE FOR AN AIRTIGHT CASE

TECHNICAL FIELD

The present invention relates to an airtight case for containing electric and electronic components, which case comprises a housing and a cover and has a structure which enables an air pressure difference between the inside and outside of the case to be equalized while maintaining the air tightness of the case.

BACKGROUND ART

A circuit-carrying substrate used in a computer or in peripheral equipment thereof includes electronic components such as transistors and an electric component such as a motor. The substrate is housed in an airtight case and electrical terminals connected to the substrate circuitry extend out of the case in a connector for connection to components outside the case.

FIG. 8(a) of tie accompanying drawings is a perspective view of a prior art airtight case and FIG. 8(b) is a longitudinal sectional view taken on line b—b of FIG., 8(a).

This known airtight case 100 comprises a housing 70 having an opening and a cover 80 made from a metal, plastics material or the like for closing the housing opening. A plurality of electrical terminals 74 extend out of the case 100 in a connector 72 which projects outwardly from one side wall of the housing 70. The terminals 74 of the connector 72 provide electrical connection between the circuitry of a substrate 50 fixed inside the housing 70 and components outside the case 70.

After the substrate 50 has been mounted inside the housing 70, a sealing packing 90 is interposed between the rim of the opening of the housing 70 and the cover 80, and the housing 70 and the cover 80 are secured together by fasteners, such as screws 60.

The resulting airtight case 100 must be completely waterproof to prevent water from entering the inside of the case.

Thus, if the inside of the airtight case 100 communicates with the outside air, the conditions of the outside air, such as the temperature and moisture of the outside air, may affect the substrate 50 inside the case 100. In particular, if humid outside air enters the inside of the airtight case 100, metal portions such as the circuitry of the substrate 50 may be corroded by the water contained in the outside air and thereby cause an electrical contact failure.

The airtight case 100 must therefore have excellent airtightness.

When an electric or electronic part inside the airtight case 100 generates heat and the temperature inside the airtight case 100 rises, the pressure in the case 100 increases due to the expansion of the air within the case. Similarly, depending on the conditions, the pressure inside the airtight case 100 may become lower than atmospheric pressure.

To equalize such pressure differences between the inside and outside of the airtight case 100, through holes may be formed in the airtight case 100.

However, if through holes are formed in the case 100, the above waterproofness and air-tightness are inevitably impaired.

To cope with this, it has been proposed to use an airtight case of the form shown in FIG. 9 of the drawings. In the airtight case 102 shown in FIG. 9, a through hole 704 opening into the connector 72 is formed in the side wall of housing 702 of the case 102 and a sealing packing 902 is provided between the connector 72 and the connector 72' of a component D to which the connector 72 is connected to prevent the through hole 704 from being exposed to the outside air. In another known arrangement shown in FIG. 10, a through hole 714 formed in the side surface of a housing 712 of an airtight case 104 is covered with cloth 716 serving to transmit only air and not moisture. These prior art structures attempt in this way to eliminate any pressure difference between the inside and outside of the airtight case 102 or 104 whilst maintaining the waterproofness and air-tightness of the case.

However, as will be clear from FIG. 9, even with the case 102 having the through hole 704 opening into the connector 72 and the packing 902 around the connector, it is impossible to retain air-tightness completely and thus impossible to prevent outside air containing moisture from entering the inside of the airtight case 102.

Further, as shown in FIG. 10, if the rough hole 714 of the airtight case 104, covered with the cloth 716 for transmitting only air and not water, becomes blocked with water, it no longer functions as a pressure control hole.

As described above, it is therefore difficult using the airtight cases 100, 102 and 104 of the prior art to eliminate a pressure difference between the inside and outside of the case while retaining the air-tightness of the case.

When it is also necessary to use the sealing packing 90 or 902, there is a further problem in that the number of parts and the production cost is increased.

SUMMARY OF THE INVENTION

According to a first aspect of the present invention, there is provided an inner and outer structure for an airtight case containing electric and electronic components and including a housing having an opening closed by a cover, in which structure a diaphragm portion made from a flexible material is integrated with the cover or the housing.

Therefore, when a pressure difference is generated between the inside and the outside of the airtight case, the diaphragm portion made from a flexible material and integrated with the cover or the housing is elastically deformed by the pressure difference, changes the inner volume of the airtight case and thereby alleviates the pressure difference between the outside and the inside of the airtight case without there being any communication between the inside of the case and the outside air.

According to a second aspect of the present invention, there is provided an inner and outer pressure equalizing structure for an airtight case containing electric and electronic components and including a housing having an opening closed by a cover, in which structure: a diaphragm having a projecting portion is sandwiched between the housing and the cover; the cover has a cut-out, and the projecting portion of the diaphragm is received in the cut-out.

Also in this case, when a pressure difference is generated between the inside and outside of the airtight case, the diaphragm having the projecting portion is elastically deformed by the pressure difference, changes the inner capacity of the airtight case and thereby alleviates the pressure difference between the inside and the outside of the airtight case without communicating with the outside air.

BRIEF DESCRIPTION OF THE DRAWINGS

FIG. 8(a) being a perspective view and

FIG. 8(b) being a longitudinal sectional view taken on line b—b of FIG. 8(a);

BEST MODE OF CARRYING OUT THE INVENTION

Figure 1A:
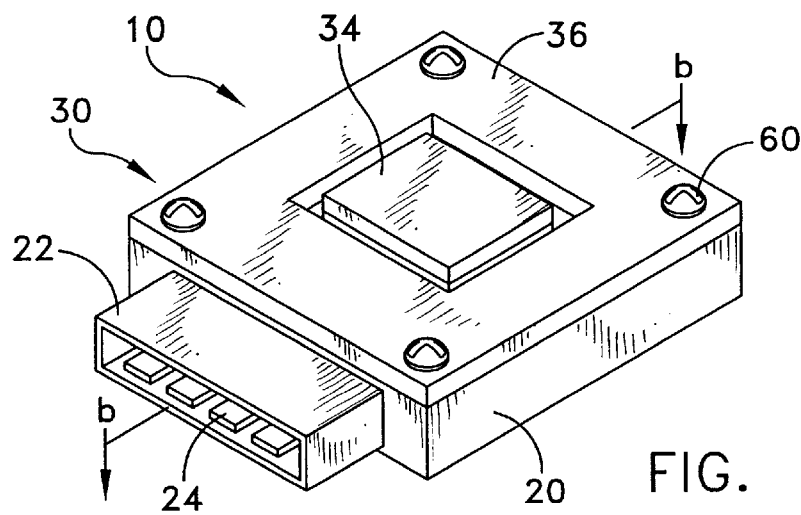
FIGS. 1(a) and 1(b) show an airtight case having an inner and outer pressure equalizing structure according to a first embodiment of the present invention, FIG. 1(a) being a perspective view and FIG. 1(b) being a longitudinal sectional view taken on the line b—b of FIG. 1(a)
Figure 1B:
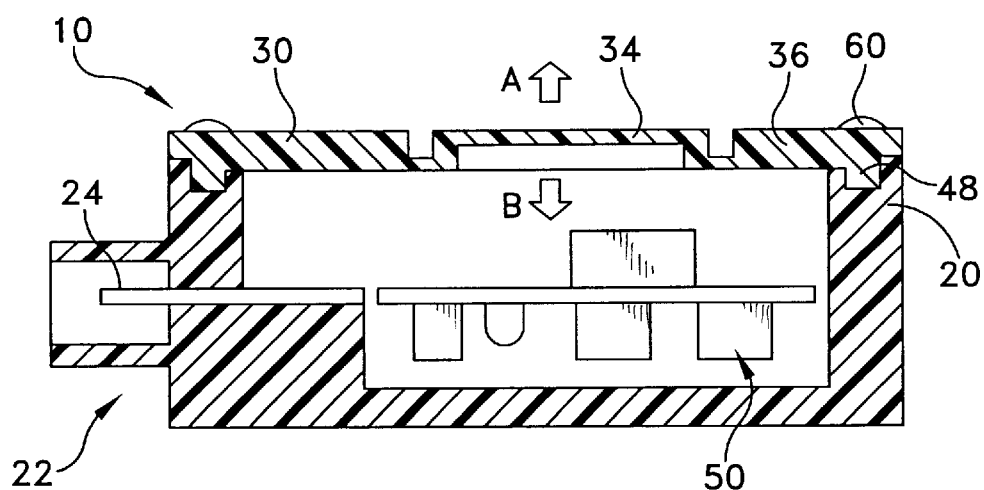

FIG. 1(a) is a perspective view showing the overall construction of an airtight case 10 incorporating an inner and outer pressure equalizing structure according to a first embodiment of the present invention, and FIG. 1(b) is a longitudinal sectional view taken on line b—b of FIG. 1(a).

The airtight case 10 is assembled by fixing a circuit substrate 50 inside an open housing 20 made from a metal, plastics material or the like and having a predetermined rigidity and then attaching a cover 30 to the housing 20 using screws 60 or the like to close the opening in the housing 20.

Since the housing 20 is of the same construction as the housing of the prior art airtight cases, it will not be described in further detail here.

The cover 30 has a thick cover portion 36 and a thin diaphragm portion 34 formed in a rectangular central portion thereof, the cover portion 36 and the diaphragm portion 34 being formed as an unitary structure from a flexible material such as nibber, plastics material or the like.

A peripheral region of the cover 30 is integrally formed with a sealing packing 38 which contacts a rim of the housing 20 extending around the opening of the housing 20.

When the pressure inside the airtight case 10 increases as a result of heat generated by electric and electronic components carried by the substrate 50 or by the circuit of the substrate 50 itself, the diaphragm portion 34 of the cover 30 elastically defonns and bulges outwardly to equalize the pressure difference between the inside and outside of the airtight case 10 (see arrow A in FIG. 1(b)).

When the interior of the case 10 cools to the same level as the temperature of the outside air after use, the pressure inside the airtight case 10 becomes equal to the outside pressure and the diaphragm portion 34 returns to its original shape.

If the pressure inside the airtight case 10 becomes lower than the outside pressure as a result of a temperature difference between the inside and outside of the airtight case 10, the diaphragm portion 34 elastically deforms and bulges inwardly of the airtight case 10 (see arrow B in FIG. 1(b)).

Due to the elastic deformation of the diaphragm portion 34 as described above, the inner volume of the airtight case 10 changes in response to a pressure difference between the inside and outside of the airtight case 10. The pressure difference between the inside and outside of the airtight case 10 can thus be eliminated to equalize the pressure inside the airtight case 10 and the outside pressure without placing the inside of the airtight case 10 in communication with the outside air.

The cover 30 is fonned as a unitary body from a soft or hard flexible material. The material of the cover 30 can be suitably selected according to the conditions under which the airtight case 10 is to be used, the rigidity required for the airtight case 10, or the like.

When a soft material is used, the cover portion 36 is made relatively thick to increase the rigidity of the cover 30. When a hard material is used, the diaphragm portion 34 is made relatively thin to facilitate flexing of the diaphragm.

Since the sealing packing 38 in the peripheral region of the cover 30 is moulded simultaneously with the moulding of the cover 30, it is not necessary to provide a separate sealing packing, thereby making it possible to significantly reduce the number of parts.

Figure 2:
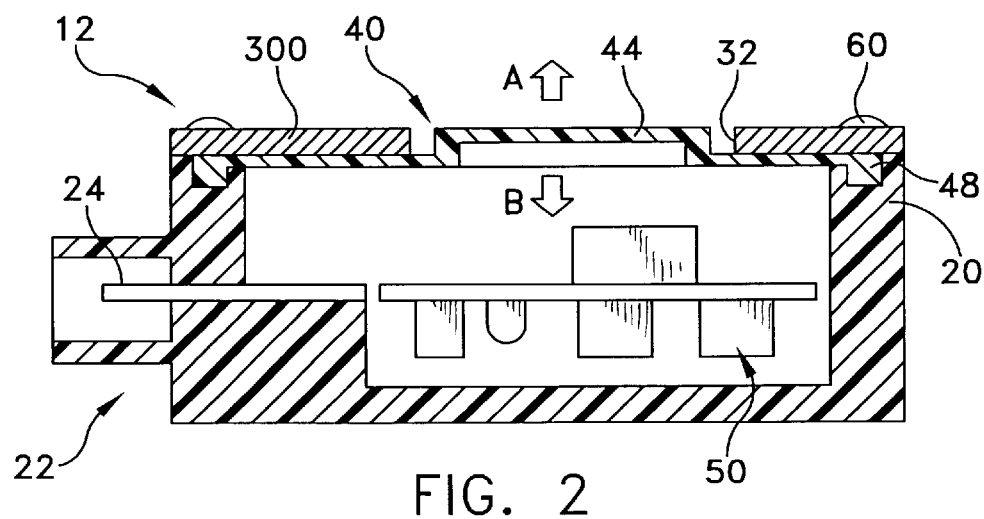
FIG. 2 is a fragmentary enlarged longitudinal sectional view of an airtight case having an inner and outer pressure equalizing structure according to a second embodiment of the present invention.

FIG. 2 is a longitudinal sectional view showing the overall construction of an airtight case 12 incorporating an inner and outer pressure equalizing structure according to a second embodiment of the present invention.

The airtight case 12 comprises a housing 20 including a connector 22 and a tab contact 24 and a cover 300 made from a metal, plastics material or the like having predetermined rigidity. The case 12 is assembled by fixing a substrate 50 inside the open housing 20 and attaching the cover 300 and a separate diaphragm 40 to the housing 20 by means of screws 60 or the like to cover the opening in the housing 20.

Since the housing 20 is of the same form as the housing of the prior art it will not be further described here.

A rectangular rut-out 32 is formed in a central region of the cover 300.

The diaphragm 40 is formed integrally from a flexible material such as rubber, plastics material or the like and has a sealing packing 48 formed in a peripheral region thereof in contact with the rim of the housing 20 and a central projecting portion 44 received in the cut-out 32 of the cover 300.

The cover 300 is placed over the diaphragm 40 so that the projecting portion 44 fits in the cut-out 32 of the cover 300 and the assembled cover and diaphragm are installed on the housing 20 by the screws 60.

If a pressure difference is generated between the inside and outside of the airtight case 12, the projecting portion 44 of the diaphragm deforms elastically (see arrows A and B in FIG. 2) and the inner volume of the airtight case 12 changes to accommodate the pressure difference as in the first embodiment.

Since the sealing packing 48 in the peripheral portion of the diaphragm 40 is moulded integrally with the diaphragm 40, it is not necessary to provide a separate sealing packing, thereby making it possible to reduce the number of parts.

Figure 3:
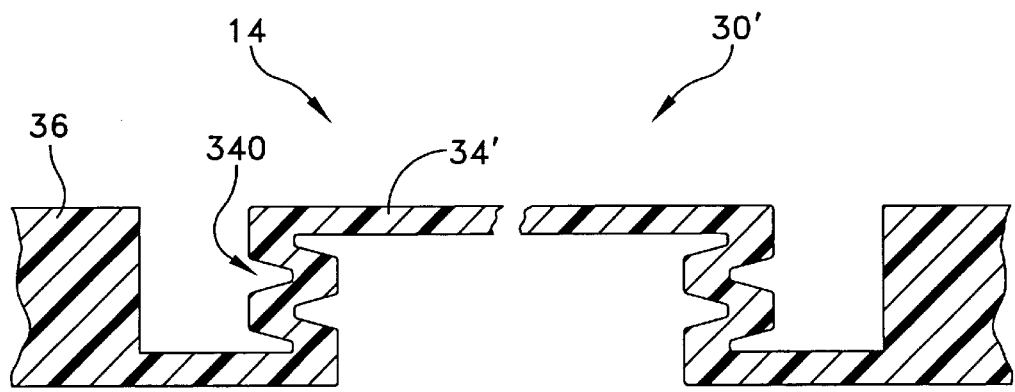
FIG. 3 is a fragmentary enlarged longitudinal sectional view of an airtight case having an inner and outer pressure equalizing structure according to a third embodiment of the present invention.

FIG. 3 is an enlarged fragmentary sectional view of an airtight case 14 to which an inner and outer pressure equalizing structure according to a third embodiment of the present invention is applied.

This airtight case 14 is assembled by attaching a cover 30' to an open housing 20 (not shown) formed from a metal, plastics material or the like having predetermined rigidity using screws 60 or the like (not shown) to cover the opening in the housing 20 as described above for airtight case 10.

Since the constitution of the housing 20 used is the same as that of the first embodiment, further description thereof is omitted.

The cover 30' used in this embodiment has a thick cover portion 36 and a thin rectangular diaphragm portion 34' formed in a central region thereof. The cover 30' is integrally formed from a flexible material as a unitary body like the cover of the first embodiment. However, the diaphragm portion 34' is shaped like a bellows 340 that can expand or contract.

In this embodiment, as the inner volume of the airtight case 14 can be changed to a larger extent by the elastic deformation of a top portion of the diaphragm portion 34' and the expansion or contraction of the bellows 340, a larger pressure difference between the inside and outside of this airtight cage 12 can be eliminated.

Although the cover 30' is also made as a unit from a soft or hard flexible material like that of the first embodiment, the particular material can be selected according to the conditions under which the airtight case 14 is to be used and the rigidity required for the airtight case 14.

When a soft material is used, the cover portion 36 is made relatively thick to increase the rigidity of the cover 36 and when a hard material is used, the diaphragm portion 34' is made relatively thin to facilitate flexing of the diaphragm portion 34' and the expansion and contraction of the bellows 340.

Figure 4:
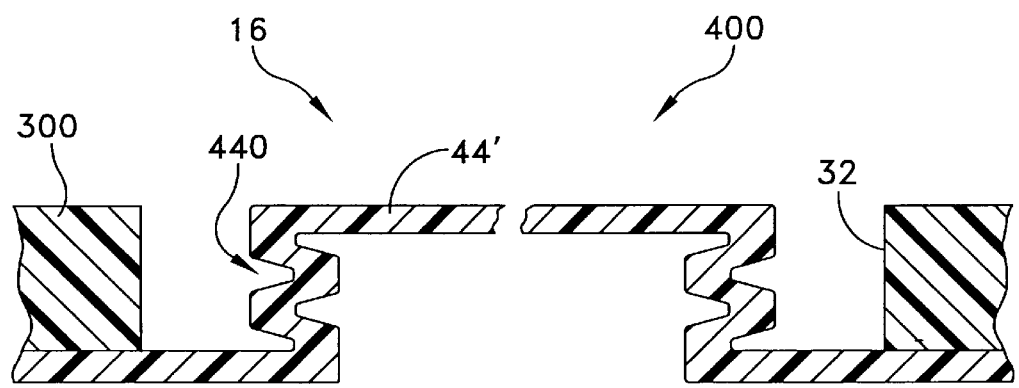
FIG. 4 is a partial enlarged longitudinal sectional view of an airtight case having an inner and outer pressure equalizing structure according to a fourth embodiment of the present invention.

FIG. 4 is an enlarged fragmentary sectional view of an airtight case 16 incorporating an inner and outer pressure equalizing structure according to a fourth embodiment of the present invention.

The airtight case 16 comprises the same housing 20 (not shown) and cover 300 as the second embodiment shown in FIG. 2 and a separate diaphragm The diaphragm 400 is integrally formed from a flexible material such as rubber, plastics material or the like and is formed in a peripheral region thereof with a sealing packing (not shown) in contact with the rim of the housing 20. A projecting portion. 44' of the diaphragm 400 fits in the cut-out 32 of the cover 300 in a central region thereof. The projecting portion 44' is shaped like bellows 440 which can expand or contract.

In this embodiment since the inner volume of the airtight case 12 can be changed to a larger extent by the elastic deformation of the top portion of the projecting portion 44' and the expansion or contraction of the bellows 440, a larger pressure difference between the inside and outside of the airtight case 12 can be eliminated as in the embodiment of FIG. 3.

In the airtight cases 12 and 16 to which tie inner and outer pressure equalizing structure of the second and third embodiments of the present invention are applied, the cut-out 32 formed in the cover 300 may have a shape other man a rectangular shape. In this case, the projecting portion 44 or 44' must be shaped to fit in the cut-out 32.

Similarly, in the cases 10 and 14 to which the inner and outer pressure equalizing structures of the first and second embodiments are applied, the cover portion 36 and the diaphragm portion 34 or 34' integrated with the cover 30 or 30' may have a shape other than a rectangular shape.

As an example of an airtight case in which the diaphragm portion has a shape other than a rectangular shape, FIG. 5 shows an airtight case 18 incorporating an inner and outer pressure equalizing structure according to a fifth embodiment of the present invention.

Figure 5A:
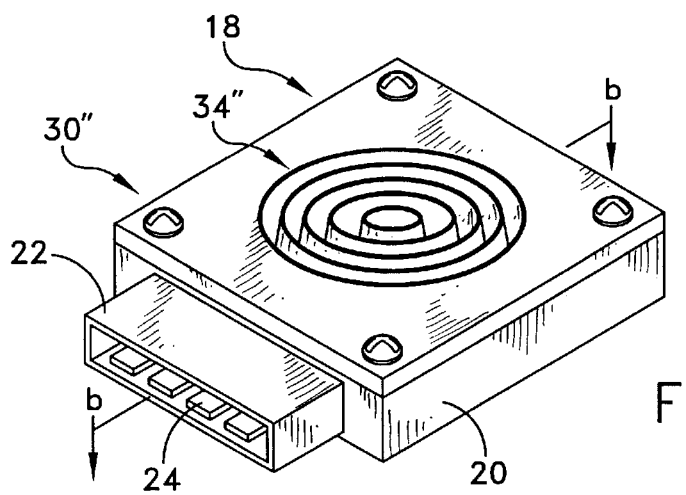
FIGS. 5(a) to 5(d) show an airtight case according to a fifth embodiment of the invention, FIG. 5(a) being a perspective view and FIGS. 5(b) to 5(d) being longitudinal sectional views taken on the line b—b of FIG. 5 (a) under different conditions of use.
Figure 5B:
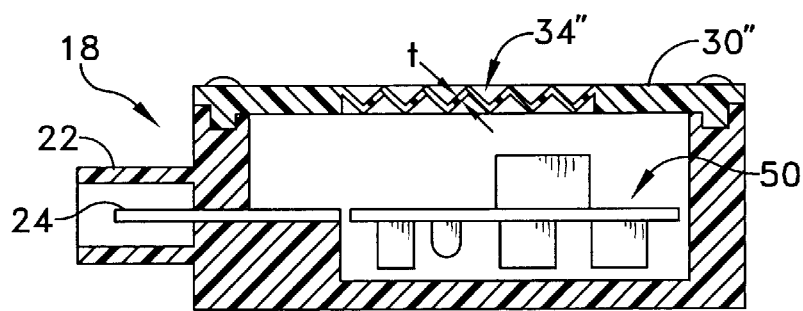
Figure 5C:
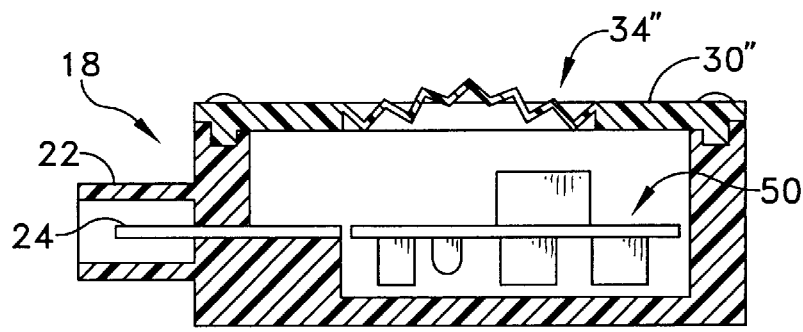
Figure 5D:
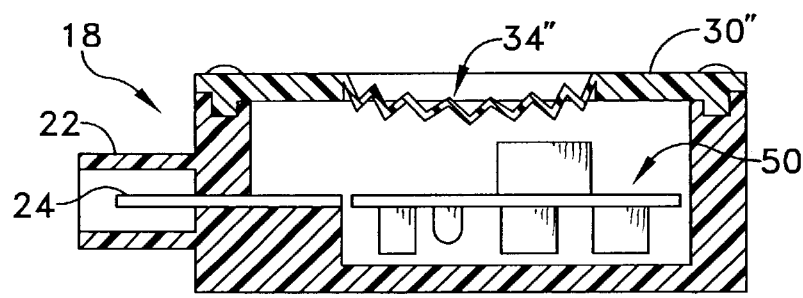

The airtight case 18 comprises the same housing 20 as in the first embodiment and a cover 30" having a concentrically corrugated diaphragm portion 34" formed in a thin portion of the cover. The longitudinal section of the diaphragm portion 34" is thus corrugated (wavy) as shown in FIGS. 5(b) to 5(d). The thickness t of the thin diaphragm portion 34" (see FIG. 5(b)) is, for example, about 0.1 to 1 mm.

FIG. 5(c) shows that the corrugated diaphragm portion 34" elastically deforms and bulges outwardly to cope with a pressure inside the case 18 which is higher than the outside pressure, while FIG. 5(d) showing the diaphragm portion 34" bulging outwardly in response to an outside pressure which is higher than the inside pressure.

In FIGS. 5, the diaphragm portion 34" is integrated with the cover 30". The diaphragm portion 34" may, however, be formed separately from the cover (not shown). In this case, the diaphragm portion may be bonded to the cover by an adhesive or screwed to the cover by providing a flange portion.

Further, the surfaces of the diaphragm portions 34, 44, 34' and 44' of FIGS. 1 to 4 may be corrugated as shown in FIG. 5.

The diaphragm portions 34 and 34' of the first and third embodiments, the projecting portions 44 and 44' of the diaphragms 40 and 40' of the second and fourth embodiments and the diaphragm 34" of the fifth embodiment are desirably recessed with respect to the outer surfaces of the covers 30, 300 and 30", respectively. The reason for this is that, if a foreign body collides with the airtight case 10, 12, 14, 16 or 18, the covers 30, 300 and 30" should take the impact to protect the diaphragm portions 34, 34' and 34" and the projecting portions 44 and 44' of the diaphragms 40 and 400 because the diaphragm portions 34, 34' and 34" and the projecting portions 44 and 44' of the diaphragms 40 and 400 generally have much lower strength than the covers 30, 300 and 30" .

Further, in the airtight cases 12 and 16 of the second and fourth embodiments, since the cover 300 and the diaphragms 40 and 400 are formed as separate units, even when the diaphragms 40 and 400 are made from a soft flexible material, the rigidity of the airtight cases 12 and 16 can be improved by forming the cover 300 from a metal, plastics material or the like having high rigidity.

Figure 6A:
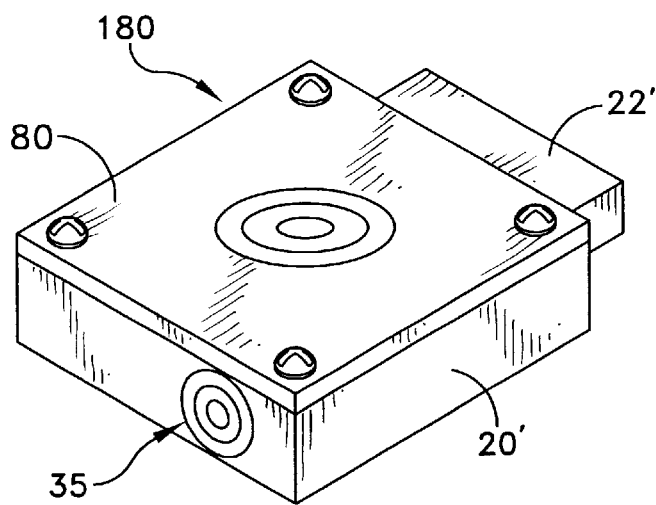
FIGS. 6(a) and 6(b) show an airtight case according to a sixth embodiment of the invention, FIG. 6(a) being a perspective view and FIG. 6(b) being a longitudinal sectional view taken on the line b—b of FIG. 6(a)
Figure 6B:
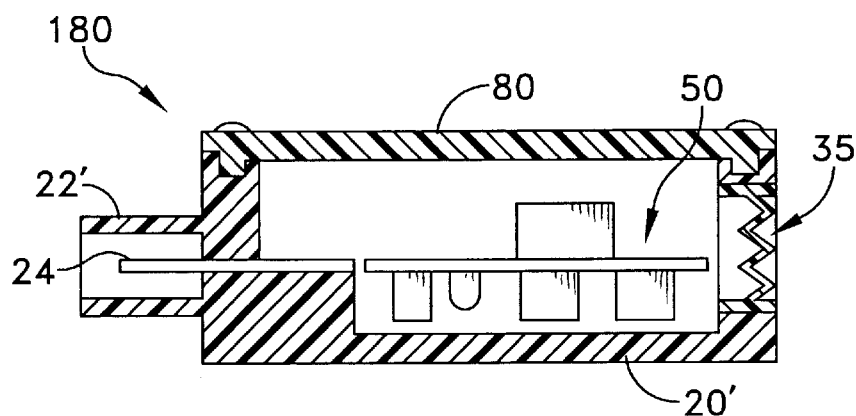

FIG. 6 is a perspective view showing the overall construction of an airtight case 180 incorporating an inner and outer pressure equalizing structure according to a sixth embodiment of the present invention.

A housing 20' of this airtight case has a diaphragm portion 35 on one side surface thereof and, unlike the preceding embodiments, an opening in the housing 20' is covered with the same cover 80 as that of the art.

Since the construction and function of the diaphragm portion 35 are the game as those of the fifth embodiment, no further description thereof will be given.

In the housing 20' of FIG. 6, the diaphragm portion 35 is formed on a side surface opposite to a connector 22' and tab contact 24 but may be formed on any side surface of the housing 20'.

A diaphragm portion 35 may be provided not only on a single side surface but also on a plurality of side surfaces of the housing 20'. In this case, a larger pressure difference can be eliminated by the plurality of diaphragm portions 35.

Further, the corrugated diaphragm portion 35 may be rectangular as shown in FIG. 1 or may include bellows as shown in FIG. 3.

With the airtight case in which the diaphragm portion 35 is formed on a side surface of the housing 20', even when a plurality of housings 20' are stacked one upon another, or when an object is placed upon the top surface of the housing 20', the elastic deformation of the diaphragm portion 35 by a pressure difference between the inside and outside of the airtight case is not prevented.

Figure 7:
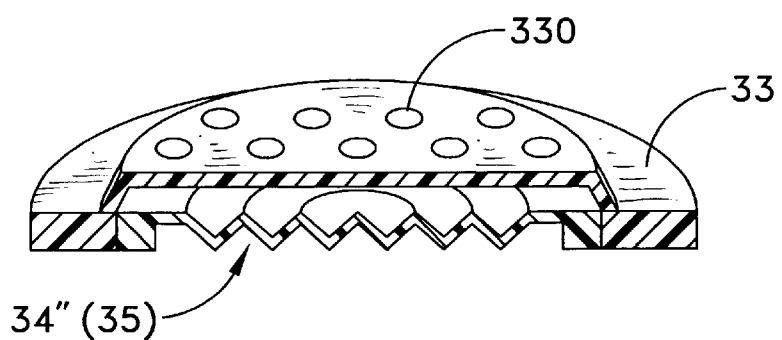
FIG. 7 shows an airtight case according to a seventh embodiment of the invention.
Figure 8A:
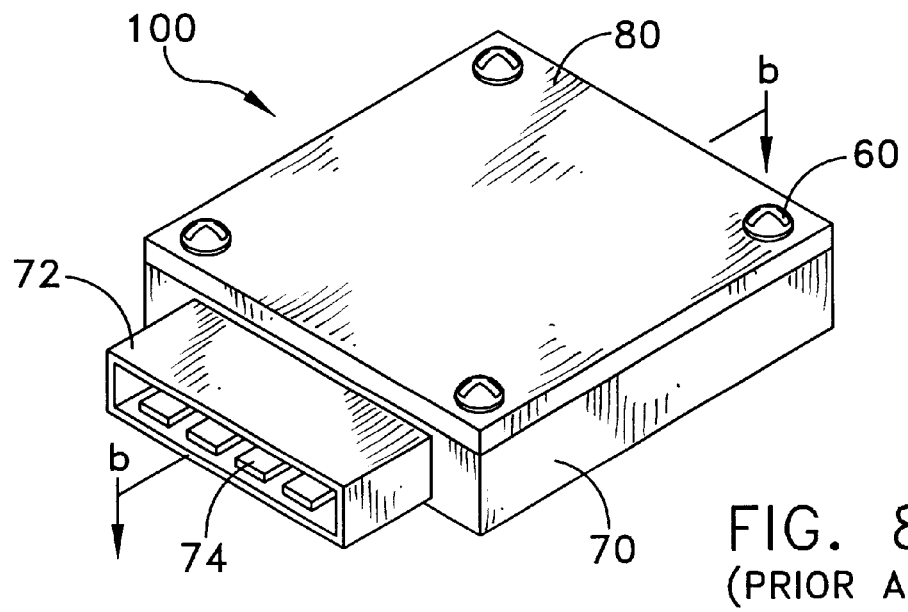
FIGS. 8(a) and 8(b) show an airtight case of the prior art.
Figure 8B:
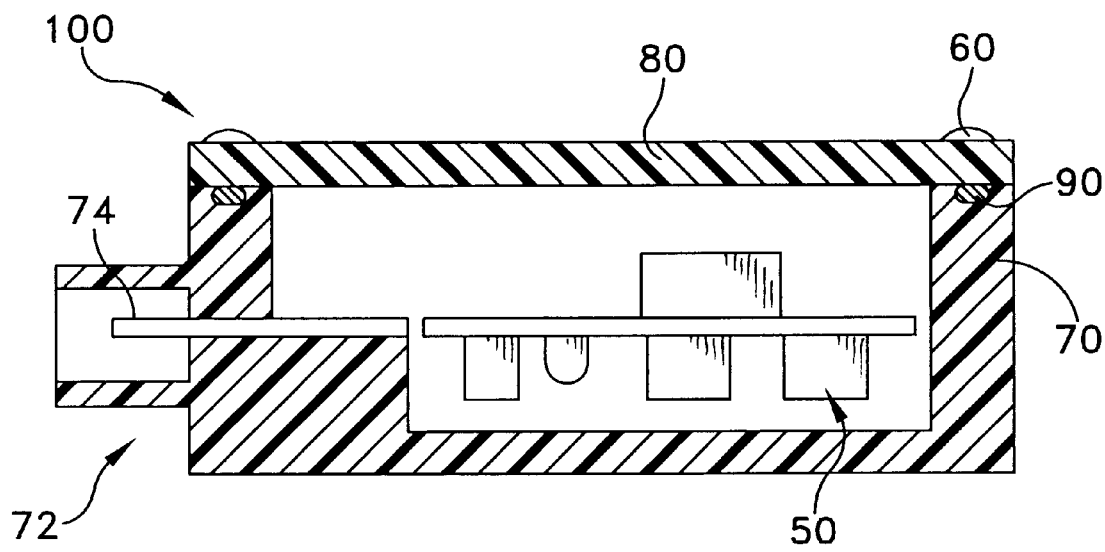
Figure 9:
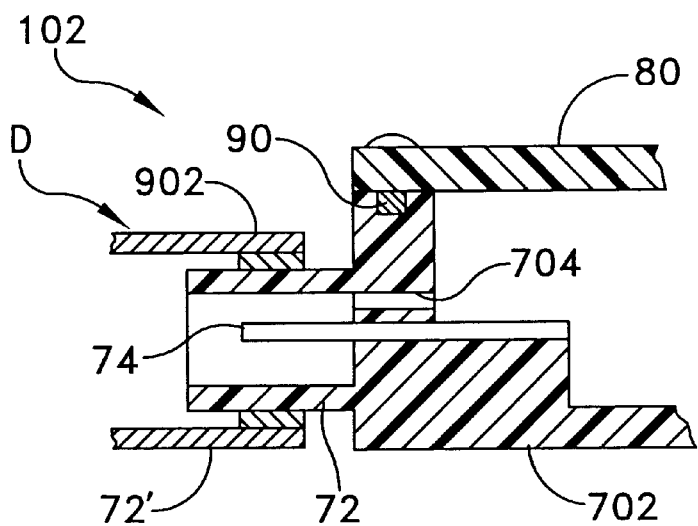
FIG. 9 is a fragmentary longitudinal sectional view of another airtight case of the prior art.
Figure 10:
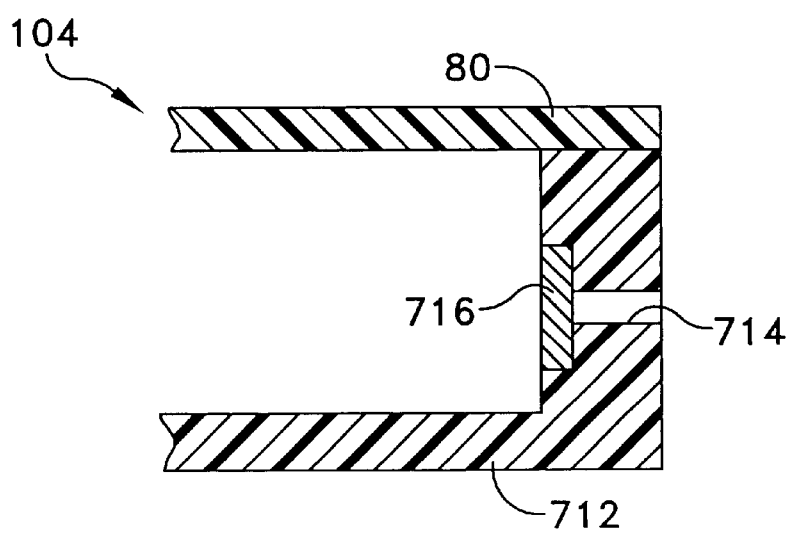
FIG. 10 is a fragmentary longitudinal sectional view of a further airtight case of the prior art.

Finally, FIG. 7 is a longitudinal cross-sectional view of an airtight case in which the outer surface of the diaphragm 34" or 35 shown in FIG. 5 or 6 is covered with a protective cover 33 made from a plastics material metal or the like to protect the diaphragm 34" or 35 (structurally weak against external force).

In this event, it is necessary to leave a sufficiently wide gap between the inner surface of the protective cover 33 and the surface of the diaphragm 34" or 35 in order to prevent the diaphragm 34" or 35 from coming into contact with the inner surface of the cover 33 when the diaphragm 34" or 35 bulges outwardly due to a pressure difference between the inside and outside of the airtight case. A plurality of through holes 330 communicating with the outside are also formed in the protective cover 33 to prevent changes in pressure between the inner surface of the cover and the diaphragm 34" or 35.

In the above embodiments, the housing and the cover are made from polybutylene terephthalate (PBT), polyphenylene sulfide (PPS), polyamide (PA) or the like. An acrylonitrile-butadiene-styrene resin (ASS), polycarbonate (PC) or the like may also be used.

The diaphragm is preferably formed from a material having a Young's modulus of $10^3$ MPa or less, such as an elastomer, rubber or silicone.

Particularly when the diaphragm is formed as a unit separate from the cover as in the second or fourth embodiments, it may be made from an elastomer or rubber which can be bonded to the cover made from a plastics material, metal or the like.

However, when silicone or urethane is used, the diaphragm and the cover must be integrated with each other as in the first and third embodiments.

The range of the pressure difference between the inside and outside of the airtight case 10, 12, 14, 16, 18 or 180 which is expected to be produced by heat generated from electric and electronic components mounted inside the airtight case or the temperature difference between the inside and outside of the airtight case during the general use of the airtight case can be estimated. Therefore, based on this finding, the material and thickness of the diaphragm portion 34, 34' or 34" or the diaphragm 40 or 400 and the size of the portion 44 or 44' can be determined according to the environment and conditions of use.

As described above, since an airtight case embodying the present invention is constructed so that the cover or the housing has a diaphragm portion made from a flexible material or a diaphragm with a projecting portion, when a pressure difference is generated between the inside and outside of the airtight case, the diaphragm portion or the projecting portion of the diaphragm elastically deforms to change the inner volume of the airtight case, thereby making it possible to alleviate the pressure difference between the inside and outside of the airtight case without placing the inside of the case in communication with the outside air.

As a result, since air-tightness is retained, the airtight case is suitable for containing electric and electronic parts.

When a diaphragm portion integrated with the cover or the housing is used, an airtight case can be constructed with a small number of parts.

When the diaphragm is formed as a unit separate from the cover or the housing, the cover or the housing and the diaphragm can be formed from different materials, thereby making it possible to improve the rigidity of the airtight case while improving the flexibility of the diaphragm.

When the diaphragm portion or the projecting portion of the diaphragm is formed like a bellows, the inner volume of the airtight case can be changed to a larger extent by the expansion or contraction of the bellows. Therefore, the range of the pressure difference between the inside and outside of the airtight case which can be accommodated is increased.

In a structure embodying the invention with an integrated sealing packing, it is not necessary to provide a sealing packing separately, thereby making it possible to provide a sealing faction with a small number of parts.

What is claimed is:

1. An inner and outer pressure equalizing structure for an airtight case containing electric and electronic components and including a housing having an opening closed by a cover, in which structure: a diaphragm having a projecting portion sandwiched between the housing and the cover; the cover has a cut-out; and the projecting portion of the diaphragm is received in the cut-out.

2. A pressure equalizing structure according to claim 1, wherein the projecting portion of the diaphragm is dish-shaped.

3. A pressure equalizing structure according to claim 1, wherein the projecting portion of the diaphragm is shaped like a bellows.

4. A pressure equalizing structure according to claim 1, wherein the diaphragm has a corrugated longitudinal section.

5. A pressure equalizing structure according to claim 1, wherein a seal is integrally formed in a peripheral region of the diaphragm.

6. A pressure equalizing structure according to claim 1, wherein the projecting portion of the diaphragm is recessed relative to an outer surface of the cover or the housing.

7. A pressure equalizing structure according to claim 1, wherein the diaphragm is covered with a protective cover having through holes.

8. An inner and outer pressure difference alleviating structure for an airtight case containing electric and electronic components and including a housing having an opening closed by a cover, in which structure a diaphragm portion made from a flexible material integrated with the cover or the housing, wherein the diaphragm portion is covered with a protective cover having through holes.

9. A pressure difference alleviating structure according to claim 8, wherein the diaphragm portion is dish-shaped.

10. A pressure difference alleviating structure according to claim 8, wherein the diaphragm portion is shaped like a bellows.

11. A pressure difference alleviating structure according to claim 8, wherein the diaphragm portion has a corrugated longitudinal section.

12. A pressure difference alleviating structure according to claim 8, wherein a seal is integrally formed in a peripheral region of the cover.

13. A pressure difference alleviating structure according to claim 8, wherein the diaphragm portion is recessed relative to an outer surface of the cover or the housing.

14. An inner and outer pressure difference alleviating structure for an airtight case containing electric and electronic components and including a housing having an opening closed by a cover, in which structure a diaphragm portion made from a rubber material and having a projecting portion integrated with at least one of the cover and the housing, wherein the diaphragm portion covered with a protective cover having through holes.

15. A pressure difference alleviating structure according to claim 14, wherein the projecting portion of the diaphragm portion is dish-shaped.

16. A pressure difference alleviating structure according to claim 14, wherein the projecting portion of the diaphragm portion is shaped like a bellows.

17. A pressure difference alleviating structure according to claim 14, wherein the diaphragm portion has a corrugated longitudinal section.

18. A pressure difference alleviating structure according to claim 14, wherein a seal is integrally formed in a peripheral region of the diaphragm portion.

19. A pressure difference alleviating structure according to claim 14, wherein the projecting portion of the diaphragm portion is recessed relative to an outer surface of the cover or the housing.

20. A pressure difference alleviating structure according to claim 14, wherein the diaphragm portion is recessed relative to an outer surface of the cover or the housing.

21. An inner and outer pressure difference alleviating structure for an airtight case containing electric and electronic components and including a housing having an opening closed by a cover, in which structure: a diaphragm having a projecting portion sandwiched between the housing and the cover; the cover has a cut-out; and the projecting portion of the diaphragm is received in the cut-out.

22. A pressure difference alleviating structure according to claim 21, wherein the projecting portion of the diaphragm is dish-shaped.

23. A pressure difference alleviating structure according to claim 21, wherein the projecting portion of the diaphragm is shaped like a bellows.

24. A pressure difference alleviating structure according to claim 21, wherein the diaphragm has a corrugated longitudinal section.

25. A pressure difference alleviating structure according to claim 21, wherein a seal is integrally formed in a peripheral region of the diaphragm.

26. A pressure difference alleviating structure according to claim 21, wherein the projecting portion of the diaphragm is recessed relative to an outer surface of the cover or the housing.

27. A pressure difference alleviating structure according to claim 21, wherein the diaphragm is covered with a protective cover having through holes.

* * * * *